(12) United States Patent
Sekiguchi et al.

(10) Patent No.: US 7,675,120 B2
(45) Date of Patent: Mar. 9, 2010

(54) INTEGRATED CIRCUIT HAVING A MULTIPURPOSE RESISTOR FOR SUPPRESSION OF A PARASITIC TRANSISTOR OR OTHER PURPOSES

(75) Inventors: Keiichi Sekiguchi, Niiza (JP); Kazuya Aizawa, Niiza (JP)

(73) Assignee: Sanken Electric Co., Ltd. (JP)

( * ) Notice: Subject to any disclaimer, the term of this patent is extended or adjusted under 35 U.S.C. 154(b) by 144 days.

(21) Appl. No.: 11/558,804

(22) Filed: Nov. 10, 2006

(65) Prior Publication Data

US 2007/0108533 A1   May 17, 2007

(30) Foreign Application Priority Data

Nov. 11, 2005   (JP) .............................. 2005-327677

(51) Int. Cl.
*H01L 29/02* (2006.01)
(52) U.S. Cl. ...................... 257/372; 257/373; 257/394; 257/547; 257/E27.063; 257/536; 257/572; 257/577; 257/580; 257/379; 257/488; 257/492; 257/E29.256; 257/E29.258
(58) Field of Classification Search .................. None
See application file for complete search history.

(56) References Cited

U.S. PATENT DOCUMENTS

| | | | | |
|---|---|---|---|---|
| 5,270,568 A | * | 12/1993 | Terashima | ................... 257/487 |
| 5,801,418 A | * | 9/1998 | Ranjan | ........................ 257/336 |
| 6,617,652 B2 | * | 9/2003 | Noda | ......................... 257/367 |

FOREIGN PATENT DOCUMENTS

| | | |
|---|---|---|
| JP | 09-065571 | 3/1997 |
| JP | 2001-135719 | 5/2001 |

* cited by examiner

*Primary Examiner*—Minh-Loan T Tran
*Assistant Examiner*—Fei Fei Yeung Lopez
(74) *Attorney, Agent, or Firm*—Woodcock Washburn LLP

(57) ABSTRACT

A composite integrated circuit incorporating two LDMOS-FETs of unlike designs, with the consequent creation of a parasitic transistor. A multipurpose resistor is integrally built into the composite integrated circuit in order to prevent the parasitic transistor from accidentally turning on. In an intended application of the composite integrated circuit to a startup circuit of a switching-mode power supply, the multipurpose resistor serves as startup resistor for limiting the flow of rush current during the startup period of the switching-mode power supply.

6 Claims, 7 Drawing Sheets

INTEGRATED CIRCUIT HAVING A MULTIPURPOSE RESISTOR FOR SUPPRESSION OF A PARASITIC TRANSISTOR OR OTHER PURPOSES

CROSS REFERENCE TO RELATED APPLICATIONS

This application claims priority to Japanese Patent Application No. 2005-327677, filed Nov. 11, 2005.

BACKGROUND OF THE INVENTION

This invention relates to integrated circuits, to monolithic integrated circuits of semiconductor devices as well as passive components, and particularly to a composite integrated circuit incorporating two or more semiconductor devices of like or unlike constructions, possibly with consequent creation of a parasitic transistor. More particularly, the invention deals with such an integrated circuit featuring provisions for preventing the conduction of the parasitic transistor, limiting current flow, or other purposes.

It has been known to integrate two or more semiconductor devices into a single microchip, with the integrated devices electrically separated from each other either by pn junction isolation or a combination of pn junction and trench isolations, as disclosed for example in Japanese Unexamined Patent Publication No. 2001-135719. The semiconductor devices are formed in and on the surface of a thin substrate of semiconductor material in planar configuration.

Let us consider a more specific example of a composite integrated circuit of two laterally-diffused, metal-oxide-semiconductor field-effect transistors (LDMOSFETs). The integrated LDMOSFET circuit includes a semiconductor substrate having a p-type region for both devices, two n-type drain regions formed on the p-type region for the respective devices, two p-type body (channel) regions formed in the respective drain regions for the respective devices, two n-type source regions formed in the respective body regions for the respective devices, and a pn separator region or a separator trench between the drain regions of the two devices.

Electrically isolated from each other via the separator region or trench, the integrated two LDMOSFETs do not normally interfere with each other. They share the p-type substrate region, however, so that the composite LDMOSFET circuit gives rise to a parasitic npn transistor composed of that p-type substrate region and the n-type drain regions of the two devices. This parasitic transistor has so far been prone to conduction as when the drain terminal coupled to the drain region of one device gains a negative potential due for example to noise. Current has flown through the parasitic transistor when the drain terminal becomes less in potential than the p-type substrate region. Then, of course, the composite LDMOSFET circuit has not operated correctly. The same problem has manifested itself when two bipolar transistors, rather than LDMOSFETs, are integrated in a like manner, too.

Japanese Unexamined Patent Publication No. 2001-135719, supra, suggests how to disable the parasitic transistor. It teaches to make the p-type substrate region higher in impurity concentration than normal and to interpose an $n^-$-type substrate region between the p-type substrate region and an $n^+$-type buried layer of the collector region. This solution is objectionable for the additional manufacturing steps required for creation of the $n^-$-type substrate region.

Japanese Unexamined Patent Publication No. 9-65571 proposes a discrete circuit for preventing the conduction of the parasitic transistor in a composite LDMOSFET circuit. The provision of the discrete anti-parasitic-transistor circuit makes the combination of this circuit and the composite LDMOSFET circuit difficult of manufacture and handling and adds to its installation space or area requirement.

The integrated composite LDMOSFET circuit has had an additional problem in its important application to a switching-mode power supply. A typical construction of the switching-mode power supply includes: (a) a transformer having a primary winding coupled to a source of DC voltage via an active switch, and a secondary winding coupled to an output rectifying and smoothing circuit for providing a DC output voltage; (b) a switch control circuit for rapidly turning the active switch on and off so as to keep the DC output voltage constant; (c) another rectifying and smoothing circuit coupled to the tertiary winding of the transformer for providing DC power needed for control purposes; and (d) a startup circuit for powering the switch control circuit from the DC source during the startup period. The startup circuit usually comprises a startup resistor for limiting the rush current during the startup period, and an LDMOSFET connected in series with the startup resistor.

Conventionally, in the switching-mode power supply of the above known design, the LDMOSFET and the startup resistor have been fabricated separately. The discrete startup resistor in particular has been an impediment to reduction in both size and manufacturing cost of the switching-mode power supply.

SUMMARY OF THE INVENTION

The present invention has it as a general object to make integrated circuits of the kind under consideration more reliable in operation and convenient of use.

A more specific object of the invention is to disable the parasitic transistor appearing in integrated circuits of the kind in question without the noted difficulties encountered heretofore.

Another specific object of the invention is to enhance the utility of integrated circuits of the kind in question in their intended applications to startup circuits or current detector circuits.

Briefly, the invention may be summarized as an integrated circuit comprising a substrate of semiconductor material having defined therein a set of regions of prescribed conductivity types for providing at least one semiconductor device. Formed on one of a pair of opposite major surfaces of the substrate are a first and a second electrode and control means for controlling current flow between these electrodes. The invention particularly features a multipurpose resistor or diode which is formed on said one major surface of the substrate via an insulating layer and which is electrically coupled to the second electrode. A bonding pad or electrode is formed on the multipurpose resistor or diode.

The multipurpose resistor or diode, being coupled to the second electrode as above, limits the magnitude of the current flowing between the first and the second electrode. In some applications of the invention in which a capacitor is connected between the first electrode and the ground, the multipurpose resistor or diode is capable of restricting the flow of rush current into the capacitor.

A representative embodiment of the invention takes the form of a composite integrated circuit incorporating a first and a second semiconductor device of unlike configurations, with a separator region therebetween for electrically isolating them from each other. The multipurpose resistor or diode according to the invention serves to prevent the conduction of the parasitic transistor that appears of necessity in this type of integrated circuit.

A further possible use of the multipurpose resistor or diode arises from the fact that they are serially connected to the current path between the first and the second electrode. The multipurpose resistor or diode may then be put to use for current detection.

It will be appreciated in particular that the multipurpose resistor or diode is an integral part of the integrated circuit, being formed directly on the substrate via an insulating layer. This offers an additional advantage in applications where a semiconductor device or devices that are capable of fabrication in the form of the integrated circuit according to the invention are put to use in combination with a discrete resistor or diode comparable to the multipurpose resistor or diode of this invention. Constituting an integral part of the integrated circuit, the multipurpose resistor or diode according to the invention replaces the conventional discrete resistor or diode, saving space or area for their installation.

A further embodiment is disclosed in which the integrated two semiconductor devices are isolated from each other by two separator regions of the same conductivity type and an anti-parasitic-transistor region of the opposite conductivity type interposed between the separator regions. The provision of this anti-parasitic-transistor region results in the creation of a second parasitic transistor, in addition to the first which is inherent in this type of composite integrated circuit. The second parasitic transistor is so configured that it will turn on upon accidental application to the second electrode of a voltage of a polarity capable of causing conduction therethrough. The first parasitic transistor will be left inactivated upon conduction of the second. Thus the first parasitic transistor is dually prevented from conduction in this embodiment, both by the multipurpose resistor or diode and by the anti-parasitic-transistor region between the two separator regions.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

Figure 1:
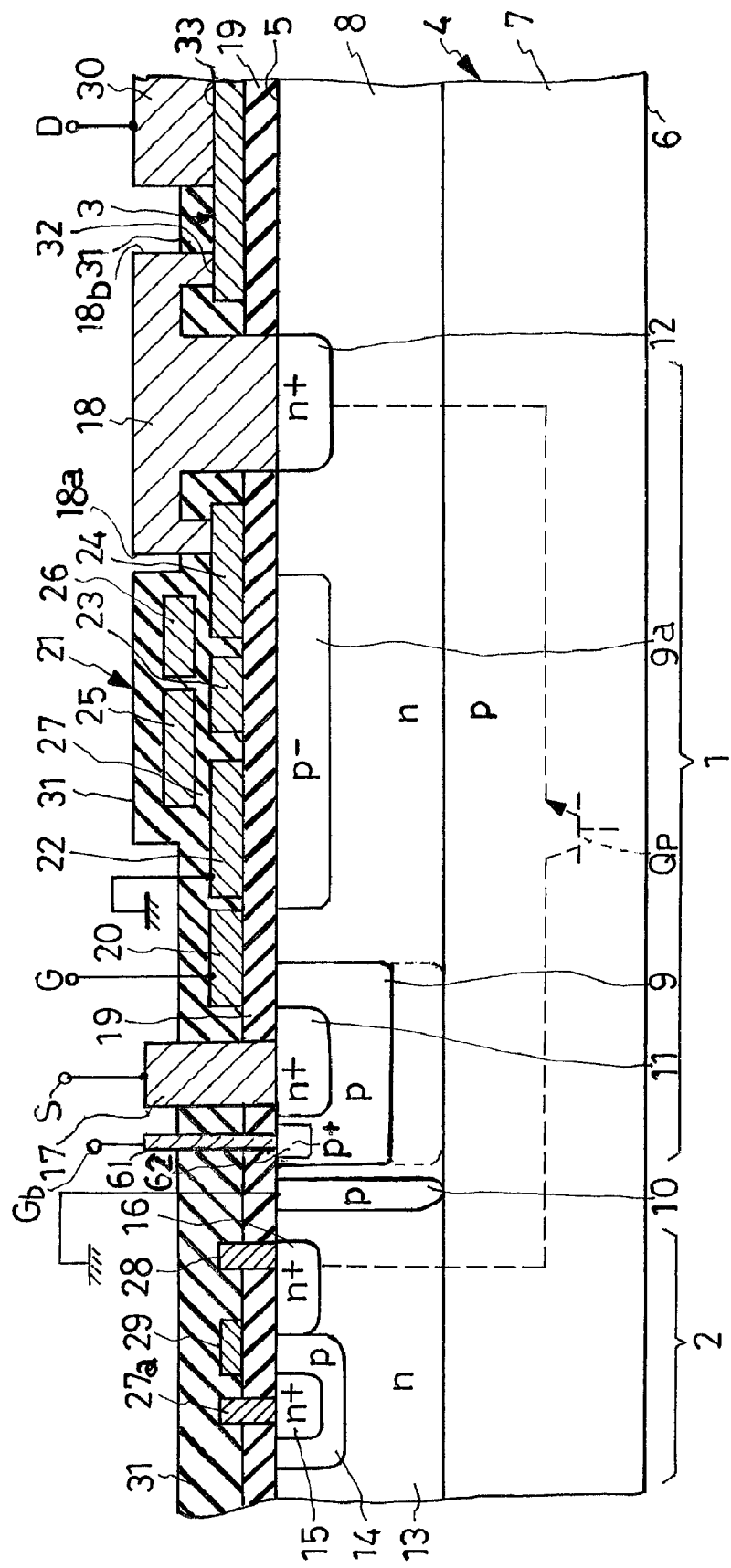
FIG. 1 is a fragmentary, schematic sectional illustration of a preferred form of composite integrated circuit embodying the principles of this invention.

The invention will now be described more specifically as embodied by way of example in the composite integrated circuit of two different semiconductor devices illustrated in FIGS. 1-3 of the above drawings. The representative composite integrated circuit broadly comprises a first semiconductor device 1, a second semiconductor device 2, and a filmlike multipurpose resistor 3 constituting a feature of this invention. The multipurpose resistor 3 is so named because it serves more purposes than one, as will become apparent as the description proceeds. The first semiconductor device 1 is shown as a high-voltage LDMOSFET, and the second semiconductor device 2 as a lower-voltage, lower-power-capacity LDMOSFET, in this particular embodiment of the invention. The multipurpose resistor 3 is connected in series with the first semiconductor device 1.

Both first and second semiconductor devices 1 and 2 are formed monolithically in and on a thin substrate 4 of semiconductor material such as silicon. The substrate 4 has a first and a second opposite major surface 5 and 6. The first major surface 5 of the substrate will be hereinafter referred to as the top surface, and the second major surface 6 as the bottom surface, for clarity. Among the regions of different conductivity types constituting the substrate 4 are a p-type first region 7 and an n-type second region 8. The first substrate region 7 is wholly exposed at the bottom surface 6 of the substrate 4. Grown epitaxially on the first substrate region 7, the second substrate region 8 is mostly exposed at the top surface 5 of the substrate 4. The second substrate region 8 serves primarily as the drain of the first semiconductor device 1. The second substrate region 8 provides pn junctions with the first substrate region 7 and with a p-type separator region 10 yet to be explained, which junctions conduce to electric separation of the two semiconductor devices 1 and 2 from each other.

Defined in the second substrate region 8 is a p-type third region 9 which provides the body region of the first semiconductor device 1. As is apparent from FIG. 2, the third substrate region 9 is annular in shape, extending circumferentially of the second substrate region 8, and is exposed at the top surface 5 of the substrate 4. The third substrate region 9 need not be exactly annular in shape but may, for example, be elliptic or polygonal.

The third substrate region 9 is shown formed to a depth short of the first substrate region 7, by diffusion of a p-type impurity into the second substrate region 8. However, as indicated by the dotted line in FIG. 1, the third substrate region 9 might extend down to the first substrate region 7.

Formed concentrically in the third substrate region 9 is an optional annular $p^+$-type region 62 which also is exposed at the top surface 5 of the substrate 4. The optional substrate region 62 has formed thereon an electrode 61 from which extends a back gate terminal $G_b$. This terminal $G_b$ is to be coupled to a constant voltage source, not shown, for potential stabilization of the third substrate region 9. Alternatively, the terminal $G_b$ may be coupled to a source terminal S yet to be referred to.

The noted separator region 10 is also annular in shape and extends from the top surface 5 of the substrate 4 down to the first semiconductor region 7, thereby electrically separating the first and the second semiconductor device 1 and 2 from each other. The separator region 10 is shown a small distance away from the third substrate region 9. However, depending upon the circuit to which the first semiconductor device 1 is to be coupled, the third substrate region 9 and separator region 10 may be placed contiguous to each other. In this case a p-type impurity may be diffused into the substrate 4 from its top surface 5 down to the first substrate region 7, and part of the impurity-diffused zone may be used as the third substrate region 9 and the remainder as the separator region 10.

An $n^+$-type fourth region 11 is formed in the third substrate region 9 for use as the source of the first semiconductor device 1. The fourth substrate region 11 is created by diffusion of an n-type impurity into the preformed third substrate region 9 from the top surface 5 to a concentration higher than that of the second substrate region 8. FIG. 2 reveals that the fourth substrate region 11 is annular in shape and concentric with the third substrate region 9, leaving part of this third substrate region exposed between itself and the second substrate region 8.

An $n^+$-type fifth region 12 of annular shape is formed in the second substrate region 8 for use as the drain of the first semiconductor device 1. The fifth substrate region 12 is also created by diffusion of an n-type impurity into the second substrate region 8 from the top surface 5 to a concentration higher than that of the second substrate region. The fifth substrate region 12 is placed concentrically inwardly of the third substrate region 9. The provision of the fifth substrate region 12 is not essential in cases where the second substrate region 8 is sufficiently high in impurity concentration.

At $9_a$ is seen an annular $p^-$-type RESURF (reduced surface field) region for uniform charge balancing on the substrate top surface 5. Created by impurity diffusion into the second substrate region 8 from the top surface 5 to a depth less than that of the third substrate region 9, the RESURF region $9_a$ lies intermediate between the third and the fifth substrate region 9 and 12.

The RESURF concept is familiar to the semiconductor specialists, as disclosed for example in U.S. Pat. No. 4,292,642, Japanese Unexamined Patent Publication No. 2005-64472, and WO 2003/075353. A variety of RESURF devices other than the illustrated RESURF region $9_a$ are adoptable to obtain the desired RESURF effect.

Figure 2:
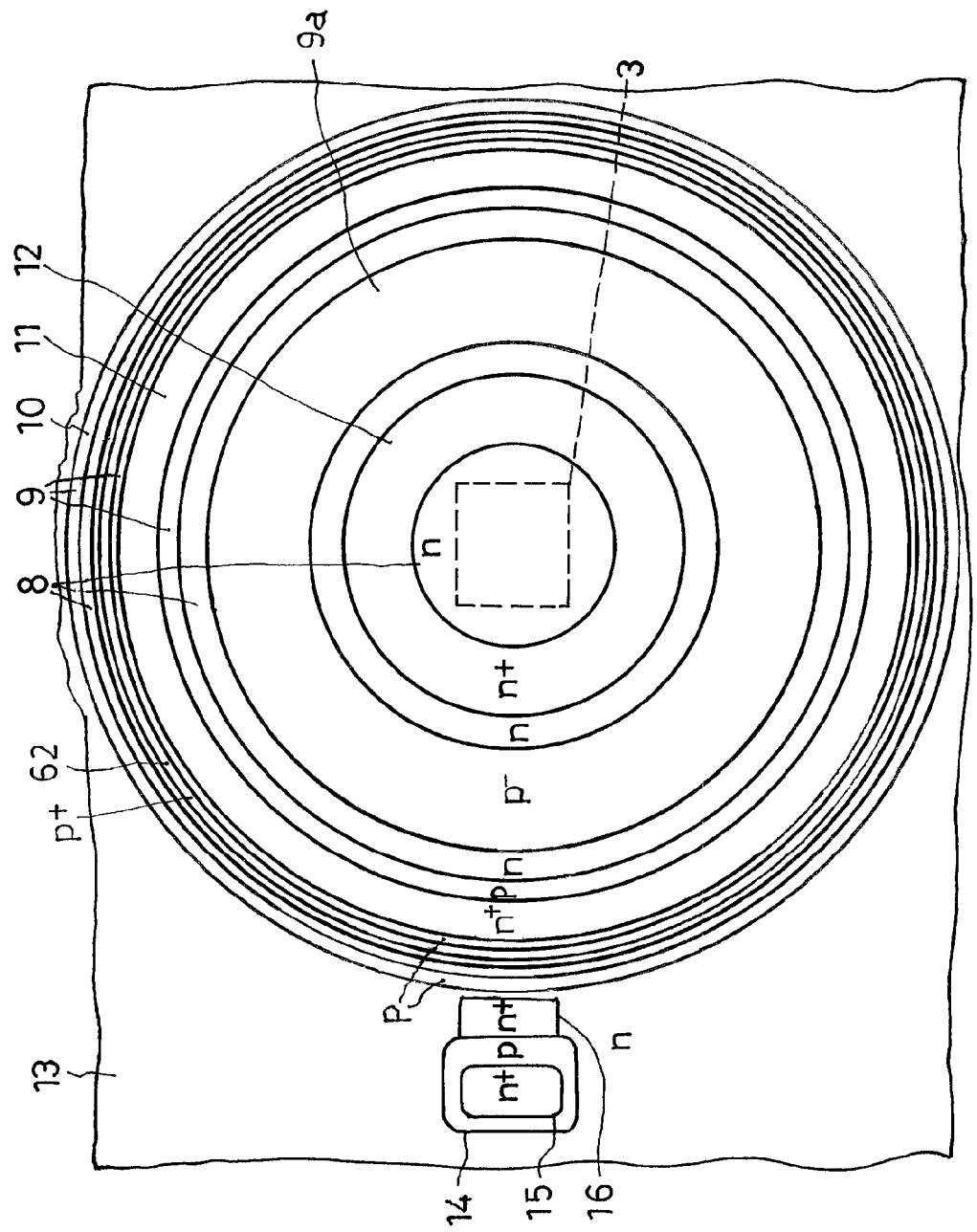
FIG. 2 is a fragmentary, schematic plan view, shown on a somewhat reduced scale, of the semiconductor substrate of the composite integrated circuit of FIG. 1.

With continued reference to FIGS. 1 and 2 the substrate regions for providing the second semiconductor device 2 include, in addition to the first substrate region 7, an n-type sixth region 13 directly overlying the first substrate region 7. The sixth substrate region 13 is grown epitaxially on the first substrate region 7 together with the second substrate region 8. The sixth substrate region 13 serves as the drain of the second semiconductor device 2.

Also included in the substrate regions for the second semiconductor device 2 is a p-type seventh region 14 which is formed, in a prescribed angular position with respect to the first semiconductor device 1, in the sixth substrate region 13 to provide the body of the second semiconductor device 2. In this seventh substrate region 14 is formed an $n^+$-type eighth region 15 to provide the source of the second semiconductor device 2. An $n^+$-type ninth region 16 is formed in the sixth substrate region 13 in a position closer to the first semiconductor device 1 than is the seventh substrate region 14. The ninth substrate region 16 provides the drain of the second semiconductor device 2.

A metal-made source electrode 17 is coupled to the fourth substrate region 11 for the first semiconductor device 1. Annular in shape, the source electrode 17 is placed concentrically upon the fourth substrate region 11. The source electrode 17 could be extended radially outwardly of the fourth substrate region 11 into contact with the third substrate region 9 as well.

A metal-made drain electrode 18 is coupled to the fifth substrate region 12. The drain electrode 18 is also annular in shape, concentrically overlying the fifth substrate region 12.

A gate electrode 20 of polycrystalline silicon (polysilicon) overlies the substrate 4 via an insulating film 19 of silicon dioxide for controlling current flow through the third substrate region 9. The gate electrode 20 is opposed to the third substrate region 9 in a position between second substrate region 8 and fourth substrate region 11. A current channel is crated adjacent the surface of the third substrate region 9 when a control signal for turning on the first semiconductor device 1 is impressed to the gate electrode 20.

The reference numeral 21 in FIG. 1 generally denotes a field plate structure overlying the second substrate region 8 in a position between drain electrode 18 and gate electrode 20 in order to enable the first semiconductor device 1 to withstand higher voltages. The field plate structure 21 is a capacitive plate configuration comprised of:

1. A first, a second, and a third field plate 22, 23 and 24 concentrically placed upon the top surface 5 of the substrate 4 via the insulating film 19.
2. A fourth field plate 25 overlying the first and the second field plate 22 and 23 via a dielectric (insulating) layer 27 of silicon dioxide for capacitively coupling these field plates 22 and 23 to each other.
3. A fifth field plate 26 overlying the second and the third field plate 23 and 24 via the dielectric layer 27 for capacitively coupling these field plates 23 and 24 to each other.

All these five field plates 22-26 of the field plate structure 21 are made from polysilicon, as is the aforesaid gate electrode 20. The first to third field plates 22-24 as well as the gate electrode 20, all overlying the insulating film 19 in coplanar relationship to one another, are capable of concurrent fabrication. Despite the showing of FIG. 1, however, the field plate structure 21 may incorporate a greater number of field plates, out of which only five are illustrated for simplicity.

The first field plate 22, which is closest to the gate electrode 20 is grounded. Positioned closest to the drain electrode 18, the third field plate 24 is coupled directly thereto. The pn junctions between the p-type first and third substrate regions 7 and 9 and the n-type second substrate region 8 are therefore reverse biased when the drain electrode 18 is higher in potential than the first and third substrate regions 7 and 9 during the off periods of the first semiconductor device 1. A depletion layer is then created under the control of the field plate structure 21 for mitigation of electric field concentration.

The provision of the field plate structure 21 is not an essential feature of this invention. It, or any other equivalent means, may be employed only when needed to impart a desired voltage-withstanding capability to the device.

The second semiconductor device 2 has a source electrode $27_a$ coupled to the eighth substrate region 15, a drain electrode 28 coupled to the ninth substrate region 16, and a gate electrode 29 coupled to the seventh substrate region 14 via the insulating film 19. The gate electrode 29 is made from polysilicon.

As indicated in phantom outline in FIG. 2, the filmlike multipurpose resistor 3 is placed centrally, and radially inwardly of the fifth substrate region 12, on the second substrate region 8 via the insulating film 19. The multipurpose resistor 3 is electrically connected between the drain electrode 18 and a bonding pad 30. The multipurpose resistor 3 takes the form of a thin, square piece of polysilicon film in this particular embodiment.

Figure 3:
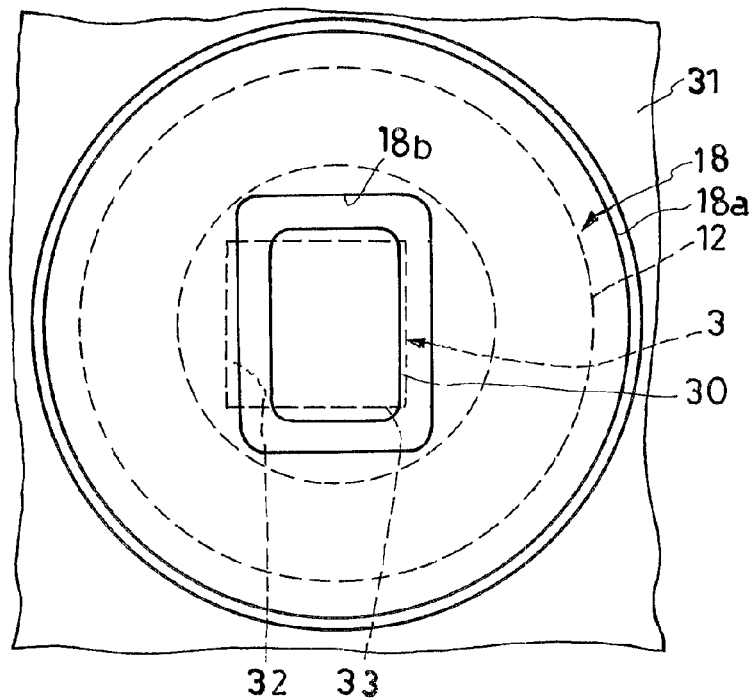
FIG. 3 is a view similar to FIG. 2 but showing the multipurpose resistor and associated parts of the composite integrated circuit on an enlarges scale.

A study of both FIGS. 1 and 3 will reveal that the drain electrode 18 is circular in shape, having an outer edge $18_a$, and has an opening $18_b$ of rectangular shape defined approximately centrally therethrough. The drain electrode 18 contacts part 32 of the surface of the multipurpose resistor 3. Received with clearance in the opening $18_b$ in the drain electrode 18, the bonding pad 30 contacts the rest 33 of the resistor surface. The multipurpose resistor 3 is sufficiently large to assure the flow of current of desired magnitude therethrough. The bonding pad 30 covers most of the surface of the multipurpose resistor 3. As desired or required, two or more different parts of the multipurpose resistor 3 might be interposed between drain electrode 18 and bonding pad 30. The multipurpose resistor 3 may even fill the complete space between drain electrode 18 and bonding pad 30.

The multipurpose resistor 3 should offer a sufficient amount of resistance to suppress parasitic transistor action, as will be later discussed more extensively, as well as to serve as the startup resistor of a startup circuit in application of this integrated circuit to a switching-mode power supply to be disclosed subsequently. For example, the multipurpose resistor 3 may be resistive enough to cause a 10-volt voltage drop for the drain current during normal operation of the first semiconductor device 1.

The bonding pad 30 is metal made for connection of wire or like conductor. The bonding pad 30 is coupled to the multipurpose resistor 3 in a position radially inwardly of the fifth substrate region 12. At 31 in FIGS. 1 and 3 is seen a protective shield of silicon dioxide or the like overlying the insulating film 19 on the substrate top surface 5.

FIG. 1 indicates at $Q_p$ the parasitic npn transistor unintentionally created in the composite integrated circuit. The parasitic transistor $Q_p$ has an emitter constituted of the second substrate region 8 and fifth substrate region 12 for the first semiconductor device 1, a base constituted of the first substrate region 7, and a collector constituted of the sixth substrate region 13 and ninth substrate region 16 for the second semiconductor device 2. The parasitic transistor $Q_p$ has conventionally turned on as follows:

Let us suppose that a negative voltage has been extraneously impressed to the drain electrode 18 or to some external circuit connected thereto, making the drain electrode less in potential than the first substrate region 1. Then, were it not for the multipurpose resistor 3, the parasitic transistor $Q_p$ would turn on, permitting the flow of a base current and possibly inviting an erroneous operation for the composite integrated circuit.

No such erroneous operation will actually occur in the illustrated composite integrated circuit thanks to the multipurpose resistor 3. Upon application of an extraneous negative voltage to the bonding pad 30 or to the external circuit coupled thereto, the multipurpose resistor 3 will cause a sufficient voltage drop to prevent the flow of a base current through the parasitic transistor $Q_p$.

It will also be noted from FIG. 1 that the multipurpose resistor 3 is serially inserted in the current path between source electrode 17 and drain electrode 18. Thus the drain current of the first semiconductor device 1 flows along the path comprising the bonding pad 30, multipurpose resistor 3, drain electrode 18, fifth substrate region 12, second substrate region 8, channel in the third substrate region 9, fourth substrate region 11, and source electrode 17. It is therefore the multipurpose resistor 3 that determines the magnitude of the current flowing through the first semiconductor device 1. As a result, in applications of this composite integrated circuit such as the one depicted in FIG. 4, in which the first semiconductor device 1 is coupled directly to a capacitor $C_1$, the flow of rush current into this capacitor is avoided.

Since the current flowing through the multipurpose resistor 3 is equivalent to the drain-source current of the first semiconductor device 1, the voltage across this resistor (i.e. voltage between drain electrode 18 and bonding pad 30) is proportional to the drain-source current. Thus, true to its name, the multipurpose resistor 3 lends itself to additional use for current detection of the first semiconductor device 1 in this particular embodiment.

Figure 4:
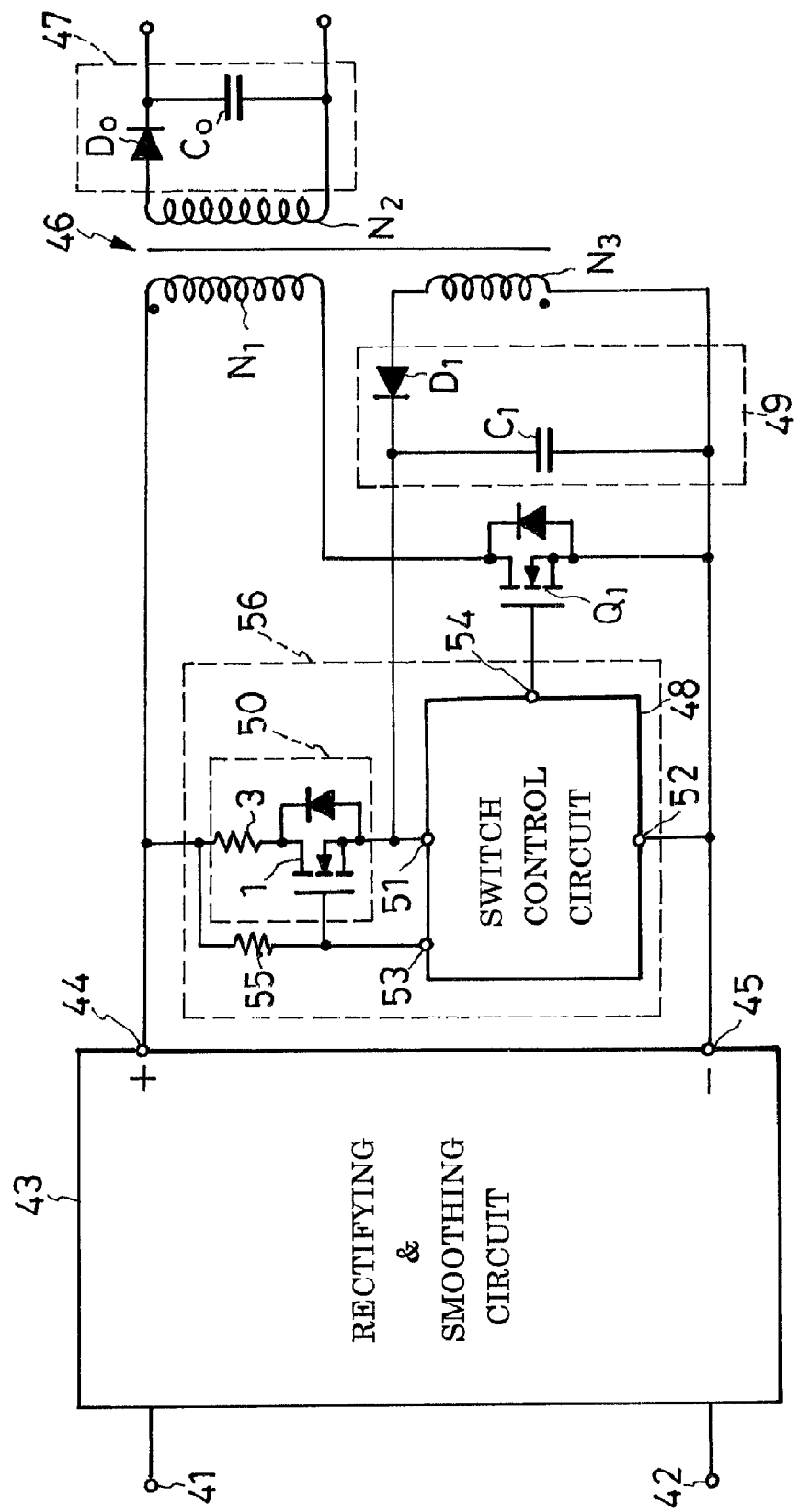
FIG. 4 is a schematic electrical diagram, partly in block form, of a switching-mode power supply incorporating the composite integrated circuit of FIG. 1.

FIG. 4 is an illustration of a switching-mode power supply incorporating the composite integrated circuit, particularly the first semiconductor device 1, of the FIGS. 1-3 construction with the multipurpose resistor 3. The switching-mode power supply broadly comprises:

1. An input rectifying and smoothing circuit 43 connected to a pair of AC input terminals 41 and 42.
2. A transformer 46 having a primary winding $N_1$ connected between the pair of DC output terminals 44 and 45 of the input rectifying and smoothing circuit 43, a secondary winding $N_2$, and a tertiary winding $N_3$.
3. An active switch $Q_1$ connected between one extremity of the transformer primary $N_1$ and the minus output 45 of the input rectifying and smoothing circuit 43.
4. An output rectifying and smoothing circuit 47 connected to the transformer secondary $N_2$.
5. A switch control circuit 48 connected to the control input (gate) of the active switch $Q_1$.
6. A control power rectifying and smoothing circuit 49 connected to the transformer tertiary $N_3$ for providing power for control purposes.
7. A startup circuit 50 connected between the plus output 44 of the input rectifying and smoothing circuit 43 and the supply input 51 of the switch control circuit 48, the startup circuit 50 being made from the first semiconductor device 1 and multipurpose resistor 3 of the composite integrated circuit described above with reference to FIGS. 1-3.

The output rectifying and smoothing circuit 47 is shown as a combination of a diode $D_o$ and a smoothing capacitor $C_o$. The control power rectifying and smoothing circuit 49 is shown as a combination of a diode $D_1$ and a capacitor $C_1$, the latter being connected in parallel with the transformer tertiary $N_3$ via the former. Connected between the pair of supply inputs 51 and 52 of the switch control circuit 48, the capacitor $C_1$ serves to power this circuit 48.

The startup circuit 50 incorporates as aforesaid the first semiconductor device 1 which has its drain connected to the plus output 44 of the input rectifying and smoothing circuit 43 via the multipurpose resistor 3, its source connected both to the supply terminal 51 of the switch control circuit 48 and to the capacitor $C_1$, and its gate connected both to the startup control output 53 of the switch control circuit 48 and to the plus output terminal 44 of the input rectifying and smoothing circuit 43 via a bypass resistor 55 which is sufficiently more resistive than the multipurpose resistor 3 to cause the current to flow solely through the latter when the first semiconductor device 1 is on.

The switch control circuit 48 delivers switch drive pulses from its output 54 to the control input of the active switch $Q_1$ for rapidly turning the same on and off. Another function of the switch control circuit 48 is to deliver from its startup control output 53 to the gate of the first semiconductor device 1 a signal for turning the same off upon lapse of a preassigned startup period of the switching-mode power supply. It is understood that the switch control circuit 48 and startup circuit 50 are integrated into a microchip 56, and that the second semiconductor device 2, FIG. 1, finds use as part of the switch control circuit 48.

When the switching-mode power supply of the foregoing construction is fed with AC power while the voltage across the capacitor $C_1$ is zero, the first semiconductor device 1 will turn on thereby causing the capacitor $C_1$ to be charged. At this juncture the multipurpose resistor 3 will serve to mitigate a current rush into the capacitor $C_1$. The switch control circuit 48 will start driving the active switch $Q_1$ when the voltage across the capacitor $C_1$ builds up to a prescribed value, and the output rectifying and smoothing circuit 47 will start providing a desired DC output voltage.

The startup period will come to an end when the capacitor $C_1$ starts to be charged from the transformer tertiary $N_3$. The switch control circuit 48 is conventionally equipped to ascertain the termination of the startup period, whereupon it will set the startup control terminal 53 at a ground potential. The first semiconductor device 1 will be thus turned off, blocking current flow through the multipurpose resistor 3 and so avoiding any further power loss here. Power loss due to some slight current flow through the bypass resistor 55 when the startup circuit 50 goes off is negligible.

The advantages offered by the composite integrated circuit of FIGS. 1-3, particularly in connection with its intended application to the switching-mode power supply of FIG. 4, may be recapitulated as follows:

1. When the bonding pad 30 or the external circuit connected thereto gains a negative potential, the multipurpose resistor 3 causes a sufficient voltage drop to keep the emitter of the parasitic transistor $Q_p$ from having a negative potential. The undesired conduction of the parasitic transistor $Q_p$ is thus avoided to prevent the composite integrated circuit from malfunctioning.
2. With the multipurpose resistor 3 connected in series with the first semiconductor device 1, the voltage across this first semiconductor device when it is turned on can be reduced by an amount equal to the voltage drop across the multipurpose resistor. The first semiconductor device is required to have a less voltage-withstanding capability than in the absence of the resistor 3.
3. Again being connected in series with the first semiconductor device 1, the multipurpose resistor 3 finds use as an indispensable part of the startup circuit 50, FIG. 4, of the switching-mode power supply in addition to use for disabling the parasitic transistor. With the multipurpose resistor 3 integrally incorporated in the startup circuit 50 as in FIG. 4, this circuit can be made less in the number of discrete constituent parts, and less in installation area requirement and in manufacturing cost, than the prior art startup circuit having a separate startup resistor.
4. Aside from use as the startup circuit of the switching-mode power supply, the placement of the multipurpose resistor 3 on that part of the substrate 4 which constitutes the first semiconductor device 1 makes this device more advantageous in size and cost when put to applications that require such a resistor.
5. Positioned centrally of the first semiconductor device 1 as seen in a plan view as in FIG. 2 or 3, the multipurpose resistor 3 does not add to the substrate surface requirement of the first semiconductor device.
6. The multipurpose resistor 3 as well as the bonding pad 30 thereon can be made large enough without interference with the other parts of the composite integrated circuit to permit the flow of relatively large starting current therethrough in the switching-mode power supply of FIG. 4.
7. The bonding pad 30 is formed on the resistor 3. Therefore, this integrated circuit can be made less in installation area requirement than the prior art integrated circuit.
8. The multipurpose resistor 3 is capable of joint fabrication with the first to third field plates 22-24, all being formed directly on the insulating film 19 and all being made from polysilicon.
9. The field plate structure 21 and RESURF region $9_a$ serve to improve the voltage strength of the composite integrated circuit.
10. The parasitic transistor $Q_p$ is prevented from conduction without sacrificing voltage strength and without adding to the surface area of the substrate 4 because the multipurpose resistor 3 is disposed inwardly of the annular fifth substrate region 12, and the field plate structure 21 and RESURF region $9_a$ outwardly of the fifth substrate region 12.

Figure 5:
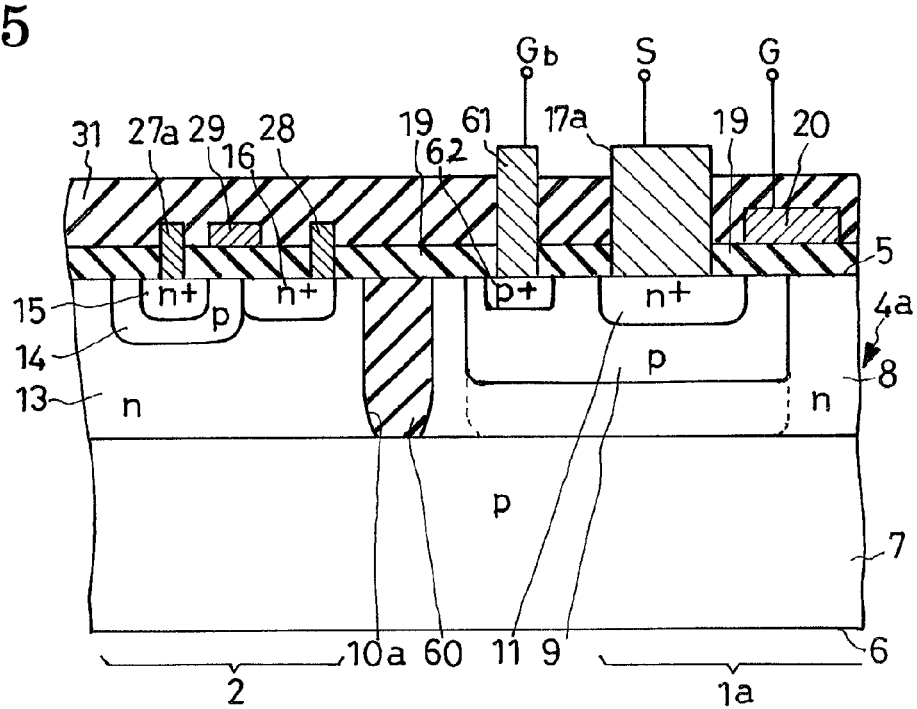
FIG. 5 is an illustration similar to FIG. 1 but showing another preferred form of composite integrated circuit embodying the principles of this invention.

Embodiment of FIG. 5

Shown fragmentarily in FIG. 5 is the second preferred form of composite integrated circuit which features an annular trench $10_a$, complete with a filling 60 of electrically insulating material, in place of the separator region 10, FIGS. 1 and 2. All the other details of construction are as previously set forth in connection with FIGS. 1-3.

The trench $10_a$ extends from the top surface 5 of the substrate 4 down to the first semiconductor region 7. Filled with the insulator 60, the trench $10_a$ electrically separates the first and the second semiconductor device 1 and 2 from each other. The trench $10_a$ could be disposed contiguous to the third substrate region 9 or body region of the first semiconductor device 1. The terminal $G_b$ extending from the electrode 61 may be connected as required to the source terminal S.

It is understood that the composite integrated circuit of FIG. 5 incorporates an multipurpose resistor similar to that seen at 3 in FIGS. 1-3 and so offers the same benefits as does the first disclosed embodiment.

Figure 6:
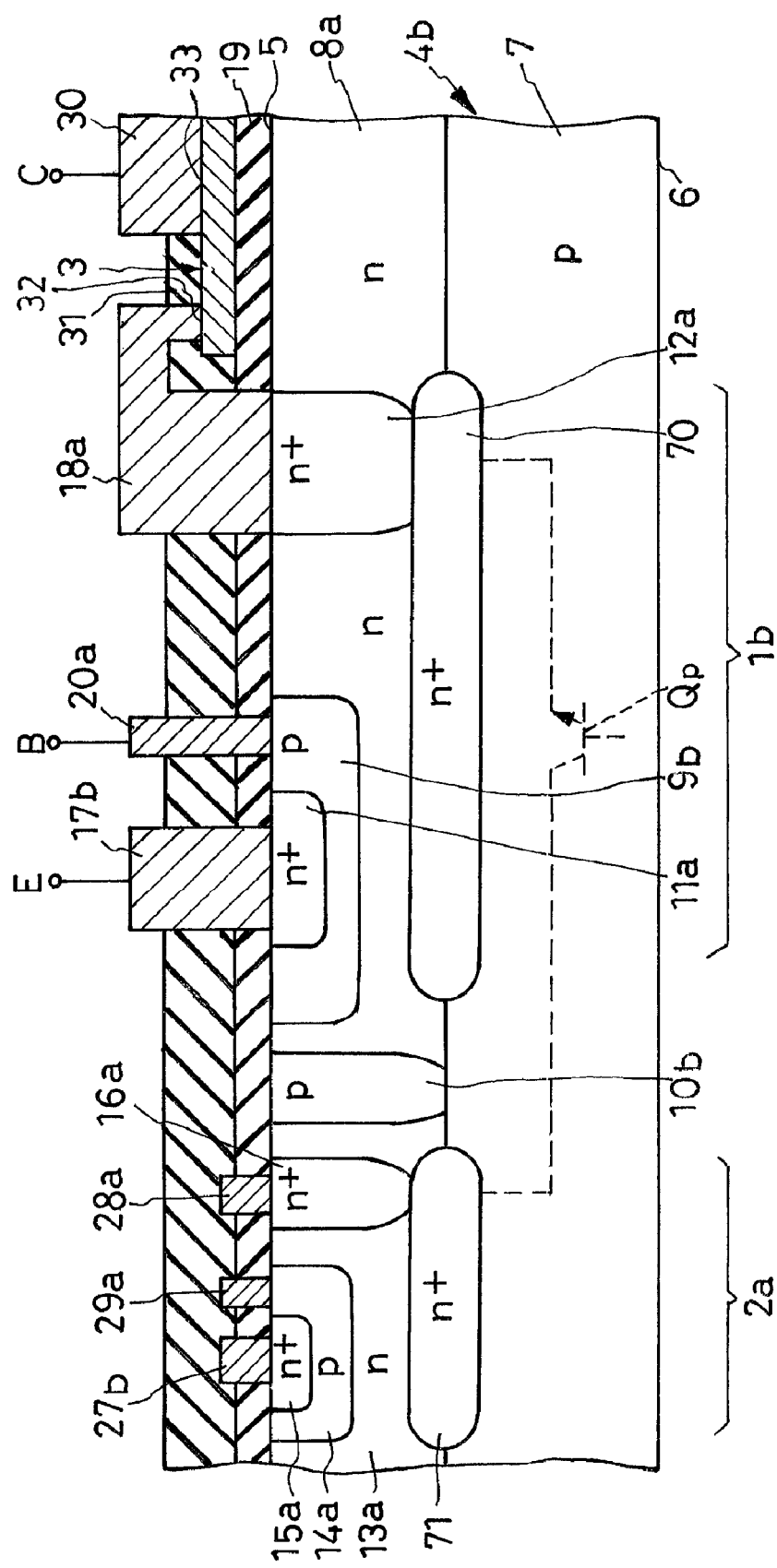
FIG. 6 is an illustration similar to FIG. 1 but showing still another preferred form of composite integrated circuit embodying the principles of this invention.

Embodiment of FIG. 6

This third preferred form of composite semiconductor circuit comprises a first bipolar transistor $1_b$ and a second such transistor $2_a$ in lieu of the LDMOSFETs employed as the semiconductor devices 1 and 2 in the FIGS. 1-3 embodiment. All the other details of construction are as set forth above in conjunction with FIGS. 1-3.

The first bipolar transistor $1_b$ is constituted of an n-type second substrate region $8_a$ as a collector region, a p-type third substrate region $9_b$ as a base region, an $n^+$-type fourth substrate region $11_a$ as an emitter region, an $n^+$-type fifth substrate region $12_a$ as a collector region, and an $n^+$-type buried layer 70. The third substrate region $9_b$ is formed island- or well-like in the second substrate region $8_a$. The fourth substrate region $11_a$ is formed island like in the third substrate region $9_b$. The fifth substrate region $12_a$ is formed in the second substrate region $8_a$, extending from the substrate top surface 5 down to the buried layer 70 which lies at the boundary between the first and the second substrate region 7 and $8_a$.

Additionally, the first bipolar transistor $1_b$ has an emitter electrode $17_b$ coupled to the fourth substrate region $11_a$, a collector electrode $18_a$ coupled to the fifth substrate region $12_a$, and a base electrode $20_a$ coupled to the third substrate region $9_b$.

The second bipolar transistor $2_a$ is constituted of an n-type sixth substrate region $13_a$ as a collector region, a p-type seventh substrate region $14_a$ as a base region, an n$^+$-type eighth substrate region $15_a$ as an emitter region, an n$^+$-type ninth substrate region $16_a$ as a collector region, and an n$^+$-type buried layer 71. The seventh substrate region $14_a$ is formed islandlike in the sixth substrate region $13_a$. The eighth substrate region $15_a$ is formed islandlike in the seventh substrate region $14_a$. The ninth substrate region $16_a$ is formed in the sixth substrate region $13_a$, extending from the substrate top surface 5 down to the buried layer 71 which lies at the boundary between the first and the sixth substrate region 7 and $13_a$. The second bipolar transistor $2_a$ also has an emitter electrode $27_b$ coupled to the eighth substrate region $15_a$, a collector electrode $28_a$ coupled to the ninth substrate region $16_a$, and a base electrode $29_a$ coupled to the seventh substrate region $14_a$.

The integrated two bipolar transistors $1_b$ and $2_a$ are electrically isolated from each other by a p-type separator region $10_b$ interposed between the second substrate region $8_a$ of the first bipolar transistor $1_b$ and the sixth substrate region $13_a$ of the second bipolar transistor $2_a$. The separator region $10_b$ extends from the substrate top surface 5 down to the first substrate region 7.

An npn parasitic transistor appears in this composite integrated circuit, too, as indicated by the broken lines labeled $Q_p$ in FIG. 6. The conduction of this parasitic transistor is prevented by the multipurpose resistor 3 which is inserted between collector electrode $18_a$ and bonding pad 30 as taught by the instant invention.

Figure 7:
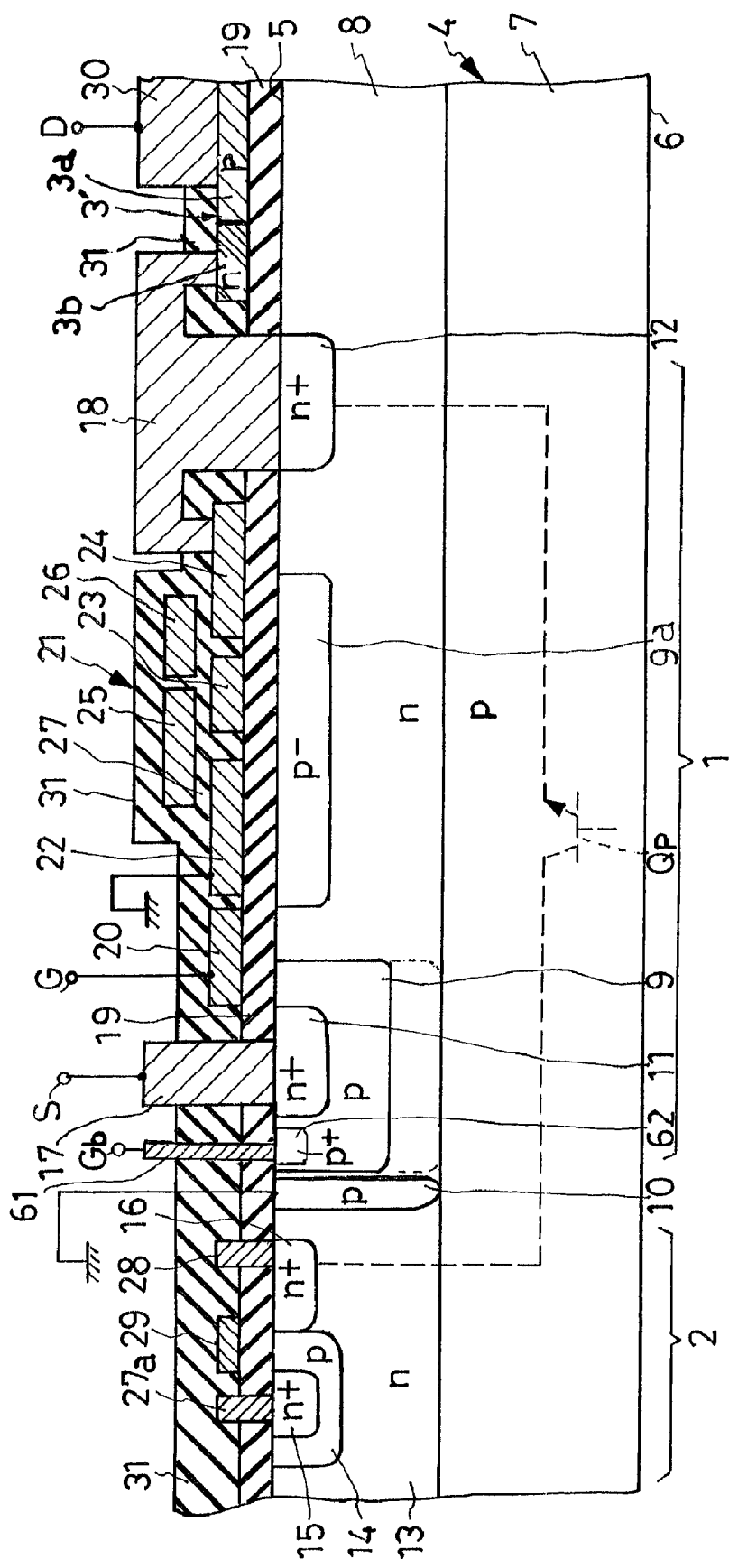
FIG. 7 is an illustration similar to FIG. 1 but showing a further preferred form of composite integrated circuit embodying the principles of this invention.

Embodiment of FIG. 7

The fourth preferred form of composite integrated circuit features a multipurpose diode 3' employed in place of the multipurpose resistor 3, all the other details of construction being as previously described with reference to FIGS. 1-3. Made from polysilicon, the multipurpose diode 3' has a p-type region $3_a$ and n-type region $3_b$, creating a pn junction therebetween. The bonding pad 30 is formed in ohmic contact with the p-type region $3_a$, and the drain electrode 18 in ohmic contact with the n-type region $3_b$. The bonding pad 30 is therefore connected to the drain electrode 18 via the pn junction between the regions $3_a$ and $3_b$ of the multipurpose diode 3'.

Electrically connected as above between drain electrode 18 and bonding pad 30, the multipurpose diode 3' is oriented to permit the flow of drain current therethrough when the first semiconductor device 1 is on. The multipurpose diode 3' is oppositely oriented with respect to the parasitic transistor $Q_p$. Consequently, when the bonding pad 30 accidentally goes negative in potential, the multipurpose diode 3' remains off thereby preventing the parasitic transistor $Q_p$ from turning on.

It is understood that the multipurpose diode 3' has a sufficient forward voltage and resistivity for limiting the drain current of the first semiconductor device 1 just like the multipurpose resistor 3 of the FIGS. 1-3 embodiment. The multipurpose diode 3' is nearly as easy of fabrication as the resistor 3, being made from polysilicon as are the field plates 22-24 and having its p- and n-type regions $3_a$ and $3_b$ created by doping of p- and n-type impurities. Additional benefits of this FIG. 7 embodiment are as enumerated above in connection with the FIGS. 1-3 embodiment. It is apparent that the multipurpose diode 3' is applicable to the embodiments of FIGS. 5 and 6 as well. As a modification of this FIG. 7 embodiment, not one but two or more multipurpose diodes, each similar in construction to the diode 3', may be connected in series between drain electrode 18 and bonding pad 30.

Figure 8:
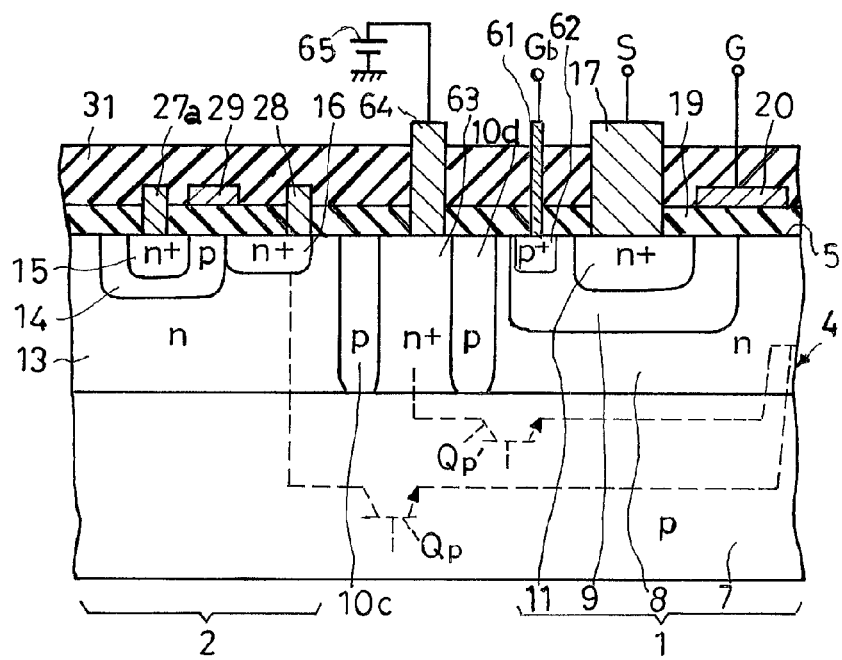
FIG. 8 is an illustration similar to FIG. 1 but showing a further preferred form of composite integrated circuit embodying the principles of this invention.

Embodiment of FIG. 8

This fifth preferred form of composite integrated circuit is similar in configuration to the first disclosed form of FIGS. 1-3 except for modifications in means for electrically separating the two semiconductor devices 1 and 2 from each other. The modified separating means include two annular separator regions $10_c$ and $10_d$ with an anti-parasitic-transistor region 63 interposed therebetween. The first separator region $10_c$ is in the same position as the separator region 10, FIGS. 1 and 2, of the first disclosed embodiment. The second separator region $10_d$ lies radially inwardly of the first separator region $10_c$ and bounds the second substrate region 8. The two separator regions $10_c$ and $10_d$ are both made by p-type doping of the substrate 4 and extend from the substrate top surface 5 down to the first substrate region 7.

Made by n$^+$-type doping of the substrate 4, on the other hand, the anti-parasitic-transistor region 63 extends from the substrate top surface 5 down to the first substrate region 7, with consequent creation of a pn junction. An electrode 64 is formed on the anti-parasitic-transistor region 63, and a bias power supply 65 is connected between this region 63 and the ground.

Two parasitic transistors appear in this embodiment. The first parasitic npn transistor $Q_p$ is constituted of the n$^+$-type fifth substrate region 12, n-type second substrate region 8, p-type first substrate region 7, n-type sixth substrate region 13, and n$^+$-type ninth substrate region 16, as in the FIGS. 1-3 embodiment. A second parasitic npn transistor $Q_p'$ is constituted of the n$^+$-type fifth substrate region 12, n-type second substrate region 8, p-type first substrate region 7, and n$^+$-type anti-parasitic-transistor region 63.

It will be noted from the foregoing that the second parasitic transistor $Q_p'$ has its collector constituted of the anti-parasitic-transistor region 63 which lies closer to the drain electrode 18 than the sixth substrate region 13. It is therefore the second parasitic transistor $Q_p'$ that will turn on when the bonding pad 30, FIG. 1, or drain electrode 18 accidentally gains a negative potential. Thereupon the first substrate region 7 will become sufficiently high in potential to prevent the conduction of the first parasitic transistor $Q_p$.

Thus the first parasitic transistor $Q_p$ is dually prevented from conduction, both by the multipurpose resistor 3 and by the anti-parasitic-transistor region 63. This composite integrated circuit is more reliable in operation than the foregoing embodiments. As an obvious modification of this embodiment the multipurpose resistor 3 is omissible where the anti-parasitic-transistor region 63 suffices for prevention of the first parasitic transistor $Q_p$ from conduction. The teachings of this embodiment are applicable to the embodiments of FIGS. 3 and 4.

Figure 9:
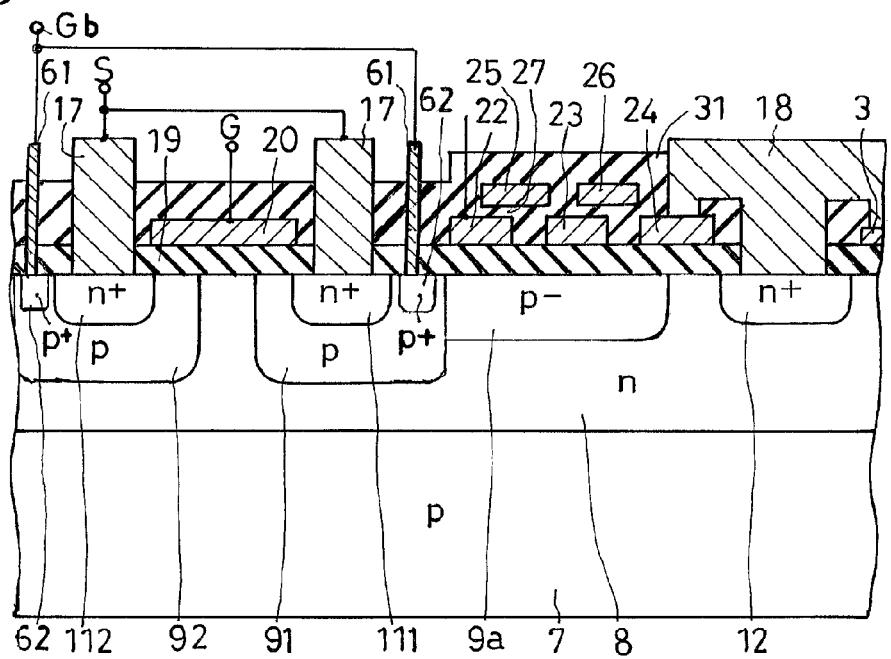
FIG. 9 is an illustration similar to FIG. 1 but showing a still further preferred form of composite integrated circuit embodying the principles of this invention.

Embodiment of FIG. 9

This embodiment differs from that of FIGS. 1-3 only in that:
1. An annular p-type first channel (body) region 91 and annular p-type second channel (body) region 92 are concentrically formed by doping in the second substrate region 8 in place of the p-type third substrate region 9 of the FIGS. 1-3 embodiment.
2. An annular n$^+$-type first source region 111 and annular n$^+$-type second source region 112 are formed by doping in the first and the second channel region 91 and 92, respectively.

3. The gate electrode 20 overlies the substrate top surface via the insulating film 19 so as to span the first and the second source region 111 and 112.

More specifically, the gate electrode 20 is in register with both the radially outer part of the first channel region 91 and the radially inner part of the second channel region 92, so that n-type channels are created at these registered parts. Since the gate electrode 20 has no part disposed radially inwardly of the first channel region 91, a p⁻-type RESURF REGION $9_a$ is created immediately radially inwardly of the first channel region 91. A p⁺-type substrate region 62 is formed in each of the two channel regions 91 and 92, and an electrode 61 is formed in direct contact with each substrate region 62.

The two channel regions 91 and 92 function like the third substrate region 9 of the FIGS. 1-3 embodiment, and the two source regions 111 and 112 like the fourth substrate region 11 of the FIGS. 1-3 embodiment. It is therefore apparent that this embodiment offers the same advantages as does that of FIGS. 1-3. The teachings of this embodiment are also applicable to the embodiments of FIGS. 5-8.

Possible Modifications

Notwithstanding the foregoing detailed disclosure it is not desired that the present invention be limited by the exact showings of the drawings or the description thereof. The following is a brief list of possible modifications, alterations or adaptations of the illustrated embodiments of the invention which are all believed to fall within the purview of the claims annexed hereto:

1. The p-type separator region $10_b$, FIG. 6, is replaceable by a trench structure.
2. The capacitive field plate structure 21, FIG. 1, is replaceable by a resistive one.
3. The multipurpose resistor 3 lends itself to use for current detection, too, by utilizing the voltage between the drain electrode 18 and bonding pad 30 in the FIGS. 1-3 embodiment or the voltage between the collector electrode $18_a$ and bonding pad 30 of the FIG. 6 embodiment.
4. The optional substrate region 62, FIG. 1, together with the associated electrode 61 is omissible.
5. With the optional substrate region 62 as well as the electrode 61 omitted, the source electrode 17 could be placed partly in contact with the third substrate region 9, FIG. 1, or with the channel regions 91 and 92, FIG. 9.
6. The second semiconductor device 2 of the FIGS. 1, 5, 7 and 8 embodiments could take the form of a bipolar transistor like that shown at $2_a$ in FIG. 6.
7. The second semiconductor device $2_a$ of the FIG. 6 embodiment could be an FET like its FIG. 1 counterpart 2.
8. The second semiconductor device 2 or $2_a$ could be a diode or the like.
9. A small-signal semiconductor device could be formed in the second substrate region 8 in a position radially inwardly of the fifth substrate region 12.
10. The composite integrated circuits disclosed above are applicable to a driver circuit of an electric motor such as a stepper motor.
11. The various regions of the semiconductor substrates 4, $4_a$ and $4_b$ of the FIGS. 1-3 and 5-9 embodiments are all reversible in conductivity type.

What is claimed is:

1. A composite integrated circuit incorporating a first and a second semiconductor device, comprising:
   (a) a substrate of a semiconductor material having a first and a second opposite major surface, the substrate having defined therein a first region of a first conductivity type exposed at the second major surface of the substrate, a second region of a second conductivity type, opposite to the first conductivity type, formed on the first substrate region and exposed at the first major surface of the substrate, a third region of the first conductivity type formed in the second substrate region, a fourth region of the second conductivity type formed in the third substrate region, the second, third and fourth substrate regions being all for the first semiconductor device, an additional region of the second conductivity type formed on the first substrate region for the second semiconductor device, and separator means for electrically isolating the first and the second semiconductor device from each other;
   (b) a first electrode formed on the first major surface of the substrate and electrically coupled to the fourth region of the substrate;
   (c) a second electrode formed on the first major surface of the substrate and electrically coupled to the second region of the substrate;
   (d) control means formed on the third region of the substrate for controlling current flow between the first and the second electrode;
   (e) an insulating layer formed on the first major surface of the substrate;
   (f) a resistor formed on the insulating layer and electrically coupled to the second electrode; and
   (g) a bonding pad on the resistor, the bonding pad being connected to the first major surface of the substrate via the resistor and the second electrode and being not directly connected to the first major surface of the substrate,
   wherein the resistor is connected between the bonding pad and the second electrode.

2. A composite integrated circuit as defined in claim 1, wherein the second electrode is annular in shape and wherein the resistor is disposed radially inwardly of the second electrode.

3. A composite integrated circuit as defined in claim 1, wherein the substrate has a fifth region of the second conductivity type formed in the second region thereof for the first semiconductor device, the fifth region of the substrate being higher in impurity concentration than the second region thereof, and wherein the second electrode is electrically coupled to the fifth region of the substrate.

4. A composite integrated circuit as defined in claim 1, wherein the substrate has a RESURF region formed in the second region thereof in a position between the third region of the substrate and the second electrode.

5. A composite integrated circuit incorporating a first and a second semiconductor device, at least the first semiconductor device being an insulated-gate field-effect transistor, the composite integrated circuit comprising:
   (a) a substrate of a semiconductor material having a first and a second opposite major surface, the substrate having defined therein a first region of a first conductivity type exposed at the second major surface of the substrate, a drain region of a second conductivity type, opposite to the first conductivity type, formed on the first substrate region and exposed at the first major surface of the substrate, a body region of the first conductivity type formed in the drain region, a source region of the second conductivity type formed in the body region, the drain, body and source regions being all for the first semiconductor device, an additional region of the second conductivity type formed on the first substrate region for the second semiconductor device, and separator means for electrically isolating the first and the second semiconductor device from each other;
(b) a source electrode formed on the first major surface of the substrate and electrically coupled to the source region of the first semiconductor device;
(c) a drain electrode formed on the first major surface of the substrate and electrically coupled to the drain region of the first semiconductor device;
(d) a gate electrode formed on the body region of the first semiconductor device via a gate insulator for controlling current flow between the source and the drain electrode;
(e) an insulating layer formed on the first major surface of the substrate;
(f) a resistor formed on the insulating layer and electrically coupled to the drain electrode; and
(g) a bonding pad on the resistor, the bonding pad being connected to the first major surface of the substrate via the resistor and the drain electrode and being not directly connected to the first major surface of the substrate,
wherein the resistor is connected between the bonding pad and the drain electrode.

6. A composite integrated circuit as defined in claim 5, wherein the first semiconductor device further comprises a field plate formed on the insulating layer for withstanding higher voltages.

* * * * *